(12) United States Patent
Jacobs

(10) Patent No.: US 7,463,469 B2
(45) Date of Patent: Dec. 9, 2008

(54) SYSTEM AND METHOD FOR CURRENT OVERLOAD RESPONSE WITH CLASS D TOPOLOGY

(75) Inventor: Karl H. Jacobs, Pleasant Valley, CT (US)

(73) Assignee: Texas Instruments Incorporated, Dallas, TX (US)

( * ) Notice: Subject to any disclaimer, the term of this patent is extended or adjusted under 35 U.S.C. 154(b) by 272 days.

(21) Appl. No.: 11/346,104

(22) Filed: Feb. 2, 2006

(65) Prior Publication Data

US 2007/0177322 A1    Aug. 2, 2007

(51) Int. Cl.
*H02H 7/00* (2006.01)
*H02H 3/00* (2006.01)
(52) U.S. Cl. .................................. 361/93.7
(58) Field of Classification Search ............... 361/93.7
See application file for complete search history.

(56) References Cited

U.S. PATENT DOCUMENTS 4,709,160 A * 11/1987 Kinoshita .................. 327/475
5,239,255 A * 8/1993 Schanin et al. ............. 323/237

* cited by examiner

*Primary Examiner*—Ronald W Leja
(74) *Attorney, Agent, or Firm*—Warren L. Franz; Wade J. Brady, III; Frederick J. Telecky

(57) ABSTRACT

A system and method for responding to a current overload condition in a power switch provides a class D topology that applies a current sink or current source to the gate of the power switch. The current sink or source decreases or increases current flowing through the power switch to regulate power switch output current in the event of an overload. A timer for current regulation can be provided to shut off the power switch if the overload condition persists. A set of differently rated switches can be used separately or together to provide a range of current regulation response, from a wide regulation range with a fast response, to a narrow regulation range with a slow response. The system provides a rapid response to an overload condition and output current regulation without disabling the power switch to overcome short term overloads.

20 Claims, 4 Drawing Sheets

SYSTEM AND METHOD FOR CURRENT OVERLOAD RESPONSE WITH CLASS D TOPOLOGY

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

1. Field of the Invention

The present invention relates generally to overload current response in a power supply output, and relates more particularly to a system and method for responding to an overload current in a power supply output FET using a class D topology approach.

2. Description of Related Art

Overload conditions in power switches are a concern for robust operation of power devices, such as power supplies or power controllers. Overcurrent conditions can lead to component damage, alter component characteristics or cause system failures, for example. Accordingly, a fast and appropriate response to current overload conditions is highly desirable in a control applied to a power switch.

FIGS. 1-3 illustrate conventional power supply control circuits for supplying power to a load. Typically, a switch, referred to herein variously as a power switch or a pass FET 15, is switched on and off to supply backplane supply power to a load 17. A capacitor Cgate is coupled to the gate of pass FET 15 to contribute to maintaining a gate voltage for enhanced operation of pass FET 15. A current sense resistor Rsense is used to sense output load current, and can indicate when an overload condition exists. In typical operation, a slew current Islew is provided to the gate of pass FET 15 to turn pass FET 15 on slowly to avoid a voltage droop or spike on the backplane power supply that can impact other power supply systems. In the case of the conventional circuit illustrated in FIG. 3, the slew current is provided by a linear op-amp 33, which is also used to respond to overcurrent conditions.

One conventional response to overload conditions in a power switch is to rapidly shut down the power switch, typically leading to a power shut down in the load coupled to the power switch. Referring to FIG. 1, a circuit for a conventional approach to controlling a power switch in the presence of a current overload is illustrated generally as circuit 10. Circuit 10 includes flip-flop 12 that acts as a latch, and overload comparator 13, that together provide a latching comparator overload response. Comparator 13 is a fast comparator that can be used to rapidly shut down pass FET 15. When pass FET 15 is rapidly shut down, power is removed from the load. Due to the latch characteristics of flip-flop 12, pass FET 15 is maintained in an off state after detection of a current overload condition.

Referring to FIG. 2, a circuit for responding to a current overload condition is illustrated generally as circuit 20. Circuit 20 includes a retry timer 24 that permits a retry response upon detection of a current overload. Circuit 20 provides a fast shut down, similar to circuit 10, and then attempts a control retry to operate pass FET 15. The fast shut down provided in circuits 10 and 20 both provide a rapid power removal from the load to render the load circuits completely off when a current overload condition is detected. The fast current overload shutdown response can also be triggered in the presence of a transient, such as may occur in switching circuits, or in the presence of noise. For example, load circuitry may include a microprocessor that can cause power spikes during turn on, or a capacitive load that can spike the power supply. Retry timer 24 may not be able to handle power spikes with differing characteristics, or may cause a power oscillation when system noise causes the current overload detector to trip.

Referring now to FIG. 3, a circuit 30 is shown for another approach to provide a response to a current overload condition. Circuit 30 includes linear op-amp 33 that acts as a controlled current limiter. Op-amp 33 contributes to controlling current provided to the load, but has a slow response time, which may result in excessive current flow. When an overcurrent condition occurs, op-amp 33 may not be able to respond in time to prevent damage or destruction to pass FET 15. Another drawback of the design of circuit 30 is that the slow response time of op-amp 33 may permit excessive current to flow causing a drop in the backplane voltage supply. In addition, linear op-amp 33 uses a large chip area to obtain a high band width circuit that has a low impedance gate drive. It can also be difficult to construct linear op-amp 33 to have stable operation over a wide range of control parameters.

It would be desirable to obtain a design for response to an overload current condition that is rapid and simple, without a large circuit size.

SUMMARY OF THE INVENTION

In accordance with the present invention, there is provided a system and method for responding to an overcurrent condition in a power switch with a class D overload current limiter topology. The topology employs a switch to draw current off of the gate of the power switch, and regulate the power supply output based on current draw. The power switch is an NMOS FET in an exemplary embodiment, and has a gate capacitor that contributes to maintaining a switch state. The capacitor on the gate of the power switch obtains a gate voltage that is high enough to fully enhance the power switch to minimize on resistance. By drawing current off of the gate of the power switch with the class D topology, the capacitor is rapidly discharged, and the power switch begins to rapidly turn off. As the power switch turns off and reduces output current, the overcurrent condition is removed, prompting the class D switches to change state. The state change permits the power switch to turn on to increase output current. If output current exceeds a threshold, the class D switches change state to turn off the power switch, thereby regulating output current.

According to an aspect of the present invention, a class D topology is coupled to the gate of a power supply output FET to operate the FET in a response to an overload current condition. According to one embodiment, a high side switch of the class D topology provides or contributes to the slew current for turning on the power FET slowly under normal operation. In the event of an overload current detection, the high side switch is turned off and the low side switch is turned on to rapidly discharge the gate voltage of the power supply output FET. Once the power supply output current drops below a given threshold, the low side switch is turned off and the high side switch is turned on to permit the gate voltage to increase. The overload response cycle can be terminated after the overcurrent condition persists for a certain time. The class D topology permits an overload current response with a low power consumption solution that can be realized in an integrated BiCMOS circuit.

According to an advantage of the present invention, the low side switch in a class D topology coupled to the gate of a power supply output FET is composed of two or more switches to obtain different regulation points for current overload conditions. One of the switches can have a higher power rating and operate to discharge a large voltage from the gate of the power supply output FET. Another switch can have a smaller rating, and be switched on/off to permit output current regulation within a relatively smaller current range. Accordingly, the larger switch is used to discharge high voltages and handle high currents for quickly responding to any current overload condition, while the smaller switch permits a closer tolerance regulation of output current near an overcurrent threshold value. By closely limiting output current during an overcurrent condition, stress on the power supply output FET can be minimized while still powering a power supply load. The reduced stress on the power supply output FET permits the FET to have a greater longevity, and reduced rating, thereby reducing cost of the power supply.

According to an advantage of the present invention, a timer is supplied in a control circuit for determining a length of time a large rating switch can be switched to the gate of the power supply output FET to draw off gate voltage and reduce output current. In addition, or alternately, a timer is supplied that determines the length of time the overload current response circuit operates before shutting down the power supply output FET. For example, the timers can be used to determine a length of time an overload condition can exist prior to latching off the power supply output FET to protect the FET and the load from damage or failure.

According to an advantage of the present invention, the backplane power supply is protected from disruptions due to current overload conditions by sensing excessive load current through a sense resistor in comparison with a reference voltage. When excessive load current is sensed, the gate voltage of the power switch is pulled down to discharge the gate capacitor. Once the load current drops to a desired level, the gate voltage on the power switch is allowed to rise once again, to avoid shutting off the power switch completely. If the overload current condition clears, normal operation resumes, permitting the power switch to operate in an enhanced mode. If another current overload condition is detected, the cycle repeats.

The present invention provides a rapid response to a current overload condition, while returning the backplane power supply to normal operating parameters within a short interval. The minimal interruption in power supplied to the load improves power supply performance. The current supply to the load is also maintained at a more constant level. In the event of a catastrophic load failure, the current drawn from the backplane supply is regulated until the power switch is shut off to avoid disruptions on the backplane supply.

According to another aspect of the present invention, the overload current control circuit can be provided as part of a hot pluggable switch that is plugged into the backplane power supply under powered conditions.

BRIEF DESCRIPTION OF THE DRAWINGS

The present invention will be better understood from the following detailed description when read with reference to the accompanying drawings in which.

DETAILED DESCRIPTION

In the following description, the phrases "turning on" and "turning off," and similar terminology, can refer to the process of turning a switch on or off, such as urging a switch further toward a completely "on" state or a completely "off" state. Also, an "on" state is meant to indicate that the switch is conducting, while an "off" state indicates non-conductance or blocking.

Figure 1:
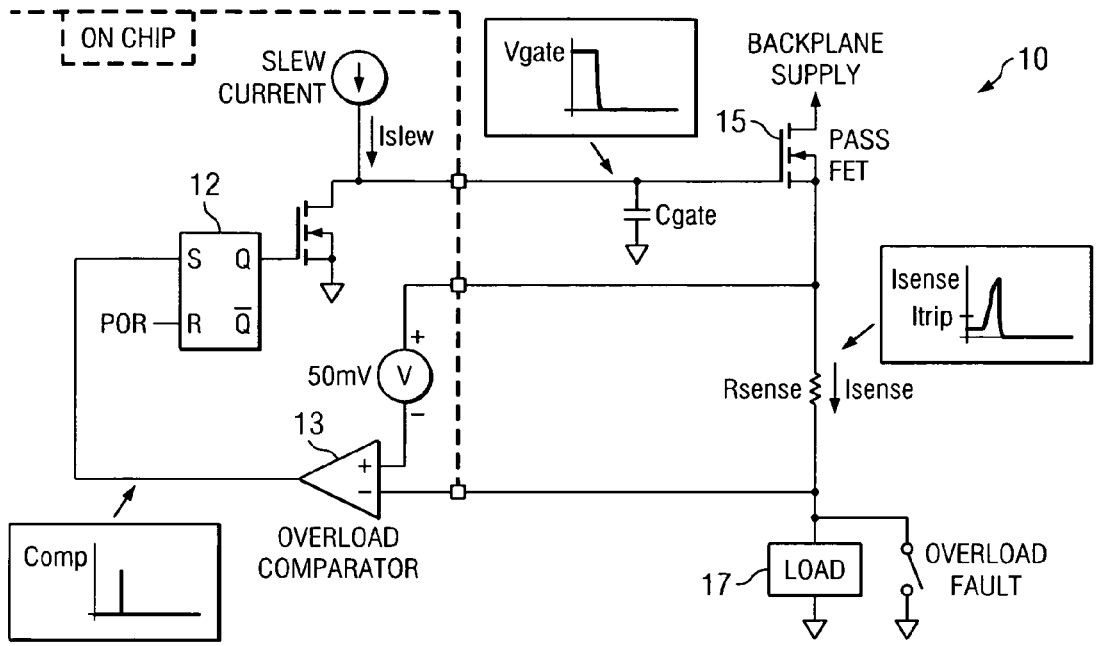
FIG. 1 is a conventional circuit for responding to current overload conditions.
Figure 2:
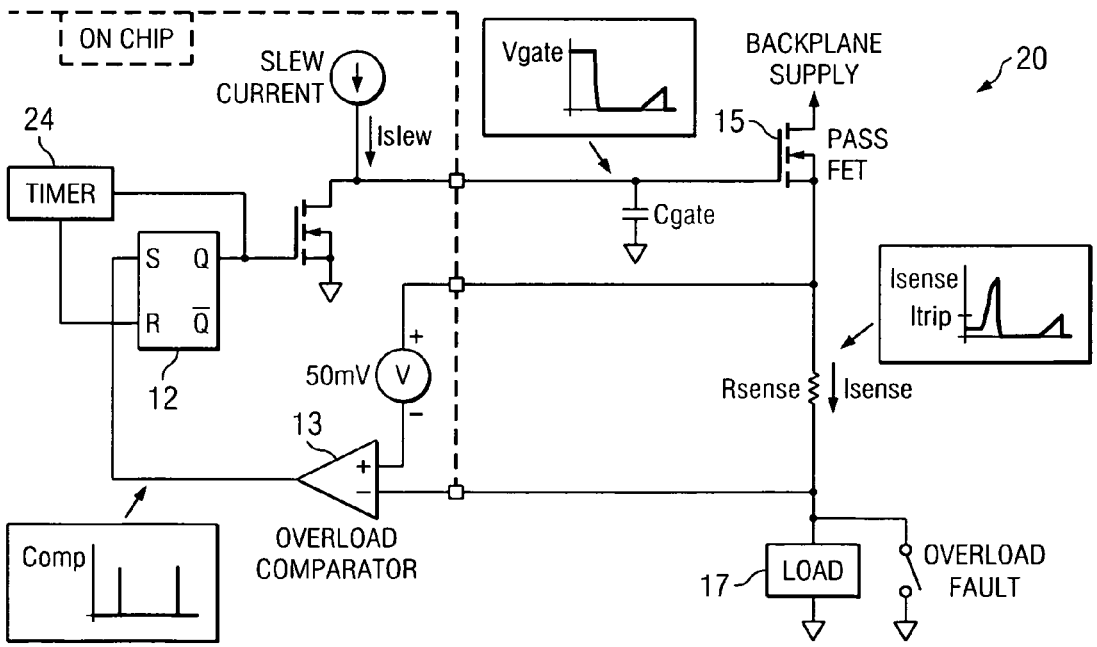
FIG. 2 is a conventional circuit for responding to current overload conditions.
Figure 3:
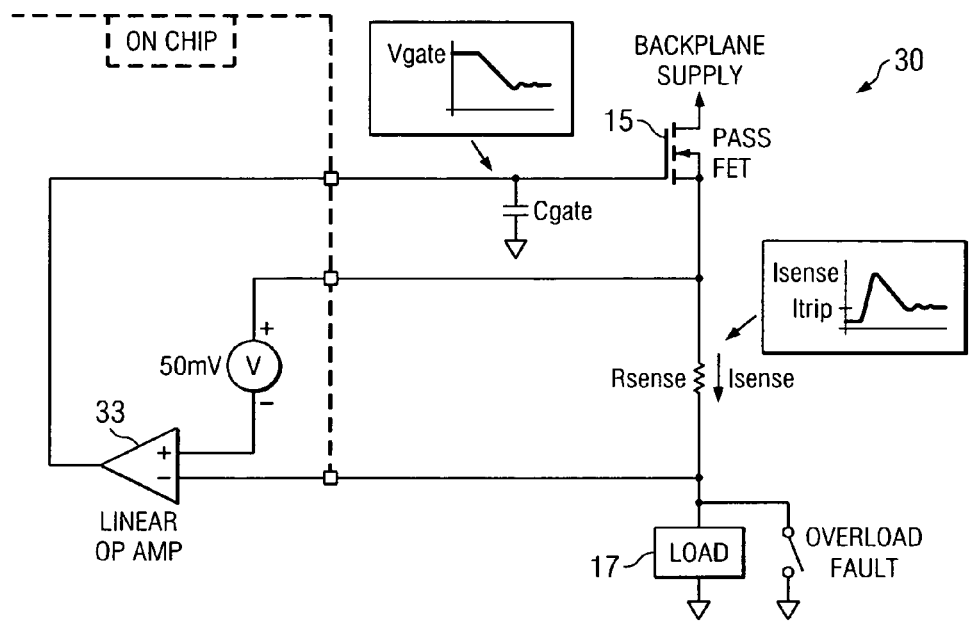
FIG. 3 is a conventional circuit for responding to overload current conditions.
Figure 4:
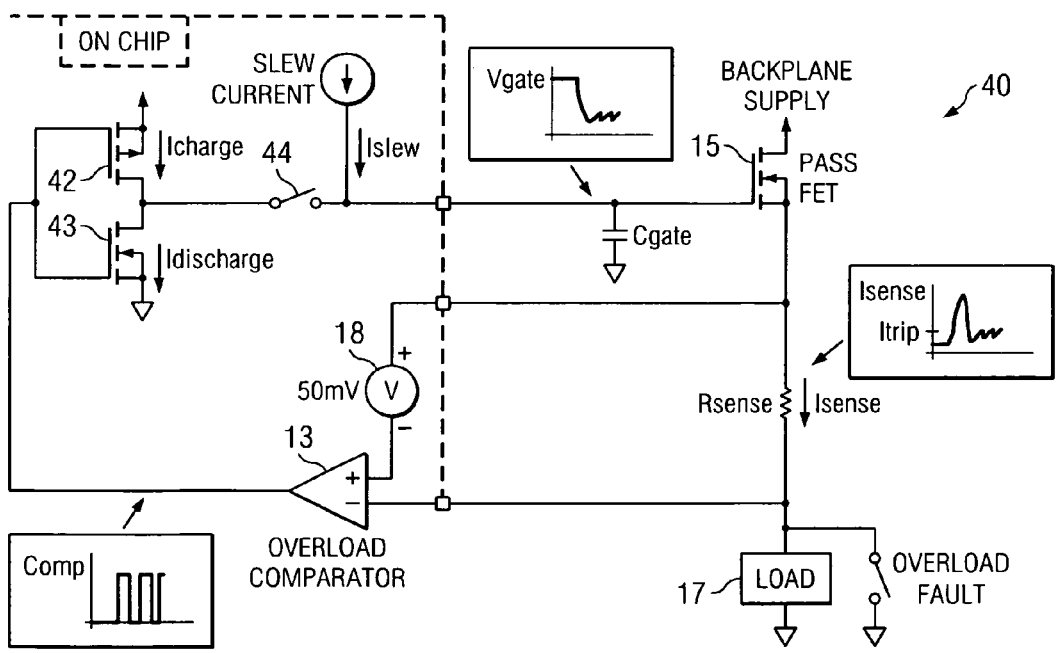
FIG. 4 is a circuit diagram of a control for responding to overload current conditions in accordance with the present invention.

Referring now to FIG. 4, a circuit 40 is illustrated for providing a control response to a current overload condition in accordance with the present invention. Circuit 40 includes overload comparator 13 that is coupled to a sense resistor Rsense for detecting overcurrent conditions in load 17. Overload comparator 13 provides a rapid response to current overload conditions and triggers in this exemplary embodiment based on a 50-milivolt threshold voltage 18. When overload comparator 13 triggers, it controls the gates of CMOS switches 42,43. Switch 42 is a P-channel MOSFET that can source current from its output to the gate of pass FET 15. N-channel MOSFET 43 can act as a current sink to draw current off of the gate of pass FET 15. Under normal conditions, switches 42, 43 can be decoupled from the gate of pass FET 15 with a switch 44. During overload conditions, switch 44 is closed and one of switches 42, 43 conducts, while the other is off. When comparator 13 is triggered, MOSFET 43 conducts to sink current off of the gate of pass FET 15 to reduce gate voltage. When comparator 13 turns off, MOSFET 42 conducts to increase the current supply to the gate of pass FET 15 to increase gate voltage.

A capacitor Cgate is coupled to the gate of pass FET 15 to contribute to controlling the gate voltage when current is sinked or sourced from or to the gate of pass FET 15. During normal operation, switch 44 may be opened or closed to permit switch 42 to contribute to keeping capacitor Cgate charged to maintain pass FET 15 in an on state. Otherwise, switch 44 may be used simply for enablement of a current overload response using the switching half bridge composed of switches 42 and 43. Furthermore, gate current Islew is provided as an abstract respresentation slew current for slow gate turn on of pass FET 15. When the current overload response circuitry is provided as a class D topology, as in circuit 40, switch 42 can operate to provide the slew current to the gate of pass FET 15, such that an additional source of slew current need not be provided.

Circuit 40 provides a slew rate limit during turnon of pass FET 15 to avoid disruptions or problematic glitches in the backplane power supply. The slew current, Islew, charges pass FET gate capacitor Cgate, and generates a linear voltage ramp on the gate of pass FET 15. In turn, this linear voltage ramp provides a slow and controlled turn on of pass FET 15 to avoid fast turn on spikes in the backplane supply. Once pass FET 15 is fully turned on, a constant current is supplied to capacitor Cgate to increase the gate voltage of pass FET 15 to a level that will enhance operation and minimize on-resistance of pass FET 15.

When an overload current condition occurs, comparator 13 triggers and switches a state of switches 42, 43 so that switch 43 pulls down on the gate of pass FET 15 to discharge gate capacitor Cgate. Pass FET 15 begins to turn off rapidly and reduces output load current. As the load current drops below a value related to comparator threshold 18, comparator 13 turns off and switches a state of switches 42, 43 to turn off gate discharge MOSFET 43. While MOSFET 43 turns off, MOSFET 42 turns on to charge capacitor Cgate to increase the gate voltage on pass FET 15 and produce a corresponding increase in output current. If load current continues to increase to again provoke an over-current condition, comparator 13 is again triggered to restart the cycle of reducing and increasing gate voltage on pass FET 15. The net effect of cycling switches 42 and 43 on and off is to modulate the load current through pass FET 15. The current level through pass FET 15 develops a voltage across sense resistor Rsense, which is compared to threshold voltage 18 to control cycling of switches 42 and 43. The cycle repeats until the current overload is removed, or pass FET 15 is disabled, with a timeout feature, for example.

According to a feature of the present invention, a timer (not shown) is provided that measures an interval of time during which the overcurrent condition exists. If the timer times out, meaning the overload current condition has existed for a time period that may be harmful to pass FET 15 or load 17, pass FET 15 is shut off to avoid damage to the circuit.

Pass FET 15 can be part of a hot pluggable circuit that plugs into a backplane power supply. Accordingly, the rapid response and current control provided according to the present invention permits a reduced impact on the backplane power supply when an overcurrent condition exists involving pass FET 15.

The configuration of circuit 40 also permits the control for pass FET 15 to recover from an overcurrent transient that may exist for a short interval, or as a small number of pulses. Accordingly, overload current transient events, such as may occur when a component in load 17 is turned on, can be accommodated without shutting down pass FET 15, or subjecting the backplane supply to voltage spikes or glitches.

Figures 5, 6:
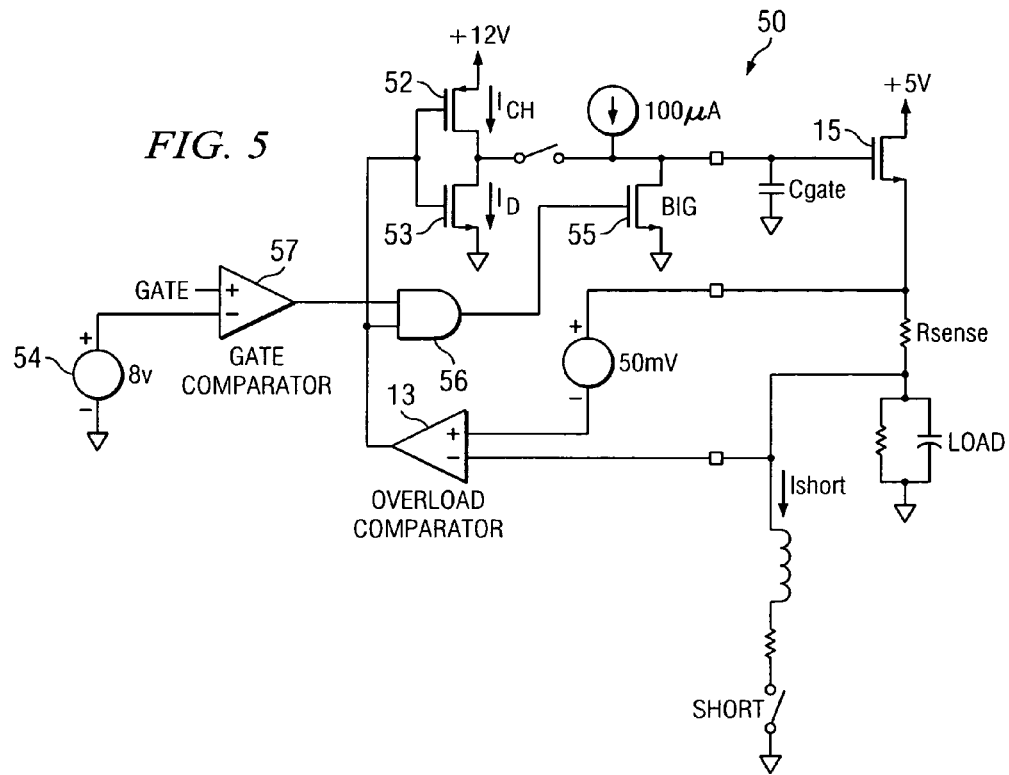
FIG. 5 is a circuit diagram of another embodiment of a control for responding to overload current conditions in accordance with the present invention.
FIG. 6 is a circuit diagram of another embodiment of a control for responding to overload current conditions in accordance with the present invention.

Referring now to FIG. 5, another embodiment of the present invention is illustrated generally as circuit 50. Circuit 50 includes overload comparator 13 that controls CMOS switches 52, 53 as illustrated in circuit 40. Circuit 50 also includes a gate comparator 57 that triggers in response to a comparison with another threshold voltage 54. The output of comparator 57 is coupled to an AND gate 56, which controls a FET 55 coupled to the gate of pass FET 15. The input of comparator 57 is the gate voltage of pass FET 15. During an overload condition when the gate voltage of pass FET rises above threshold 54, comparator 57 is triggered to turn on AND gate 56 and FET 55, thereby turning off pass FET 15. The use of FET 55 permits a control to be applied to the gate of pass FET 15 to obtain more precise regulation of current through pass FET 15. In this embodiment, switch 53 can be a relatively higher rated FET to draw current rapidly off of the gate of pass FET 15 for a fast initial response. A loop response speed of 100-200 KHz may be obtained for example, depending on gate capacitor Cgate and FET 55 parameters. FET 55 can be a relatively lower rated FET for use in a tighter regulation control of output current.

Referring now to FIG. 6, another embodiment according to the present invention is illustrated with a control circuit 60. Control circuit 60 includes a fast response switch 64 and CMOS switches 62, 63 that contribute to modulation of output current in an overload condition. Switch 64 is a fast response switch with a high rating sufficient to draw a large current in a short time to quickly turn off pass FET 15 and reduce output current supplied by pass FET 15. CMOS switches 62, 63 are slower response switches with lower ratings that use less power. Switches 62-64 are operated during overload conditions to regulate output current within a given range.

In an initial response to an overload condition, switch 64 is turned on to quickly pull down the gate of pass FET 15. The responsiveness of switch 64 permits pass FET 15 to quickly turn off, rapidly reducing output current to avoid component damage or destruction due to current overloads. For example, switch 64 can respond in approximately one microsecond to begin turning off pass FET 15 and reduce output current.

Figure 7:
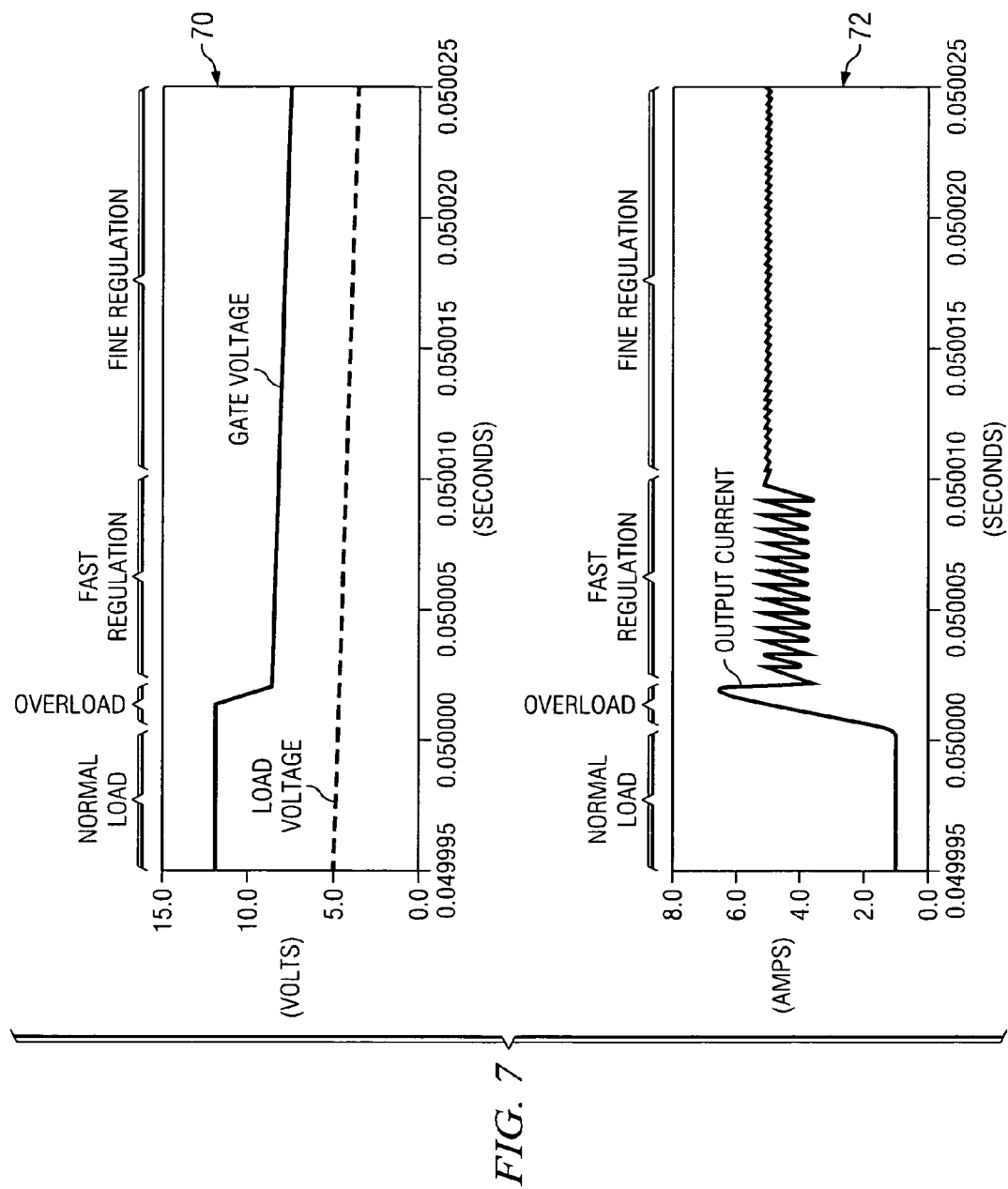
FIG. 7 is a graph illustrating operation of the overload current response in accordance with the present invention.

As output current is reduced, current through sense resistor Rsense is reduced and the corresponding voltage applied to overload comparator 13 eventually falls below threshold voltage 18. When the sensed voltage related to output current falls below threshold voltage 18, comparator 13 turns off, signaling block 65. Block 65 includes logic and timers to turn off switch 64 to permit pass FET 15 to turn on to continue to supply output current. Block 65 also times an interval while an overload condition exists, and switches switch 64 to provide a rough output current regulation within a relatively large range during the interval. That is, while the overload condition exists, and the timer has not timed out, block 65 provides a signal 68 to operate switch 64 to turn pass FET 15 on or off to regulate output current. Block 65 generates signal 68 to operate switch 64 based on the output of comparator 13. Accordingly, as the sensed voltage applied to comparator 13 falls below threshold 18, meaning the output current is within an acceptable range, block 65 modifies signal 68 to turn switch 64 off. As switch 64 turns off, pass FET 15 turns on and increases output current. If output current again exceeds the desired range indicated by threshold 18, pass FET 15 is again turned off quickly to avoid damage or destruction of the device. In part because switch 64 is a fast response switch, output current regulation generally falls within a relatively large range. The closed loop response through comparator 13 is relatively fast, and regulation of current through pass FET 15 with switch 64 can produce output current swings that are relatively large, resulting in a relatively wide range of output current values. The rough regulation cycle of output current continues during an overload condition while the timer in block 65 permits signal 68 to be active. Once the rough interval timer expires, signal 68 is inactive and switch 64 is placed in a non-conductive state. FIG. 7 illustrates the response of circuit 60 during overload and fast response intervals.

Once the fast regulation interval represented by the timer in control block 65 expires, the rough output current modulation response to the overload condition ends. If an overload condition continues to exist, block 65 continues regulation with a new interval of fine current regulation. Signal 67 supplied to the gates of switches 62, 63 provides a mechanism for further, fine current regulation during an overload condition. Signal 67 may be active during an overload condition only, and can act in conjunction with signal 68, or independently. Switches 62, 63 are MOS-gated switches with slower responses and lower ratings than switch 64 to permit current regulation within a smaller range of values for the output of pass FET 15. As shown in the exemplary embodiment of circuit 60, switches 62, 63 are CMOS switches that alternate conductive cycles depending on a state of signal 67. With this mechanism, control block 65 uses signal 67 to turn off switch 63, and cause switch 62 to conduct to supply current to charge gate capacitor Cgate and turn on pass FET 15. Control block 65 also signals switch 63 to turn on while turning off switch 62 to discharge gate capacitor Cgate and turn off pass FET 15. Switching switches 62, 63 to turn pass FET 15 on and off during an overload condition produces a fine current regulation cycle. The regulation cycle for switching switches 62, 63 is based on output current sensed through resistor Rsense and supplied to overload comparator 13 for comparison with threshold voltage 18. When switch 62 is on during an overload condition, current output through pass FET 15 rises and exceeds the threshold value represented by threshold voltage 18. At that point, comparator 13 changes state and signals block 65 that an overload current is being drawn. Block 65 modifies signal 67 to change a state of switches 62, 63, to permit pass FET 15 to turn off. Accordingly, switch 63 turns on to slowly draw current off the gate of pass FET 15 and discharge gate capacitor Cgate to slowly reduce the current supplied by pass FET 15. As the current output through pass FET 15 decreases below a value relative to threshold 18, comparator 13 changes state again, causing control block 65 to turn off switch 63. Switch 62 turns on to again charge gate capacitor Cgate and turn on pass FET 15. As current increases through pass FET 15 above a value relative to threshold 18, comparator 13 changes state and signals control block 65 to change the states of switches 62, 63. Switch 63 in a conductive state draws current off of the gate of pass FET 15, reducing the voltage on capacitor Cgate to turn pass FET 15 off. This cyclic control obtains a regulation of output current that is within a smaller range of values than that which may easily be obtained with switch 64. Accordingly, switch 64 is used as an initial response to quickly reduce and regulate output current in the event of an overload. Switch 64 is active for a certain interval of time prescribed by timing logic in control block 65. After the rough, fast response and regulation interval, block 65 operates fine current regulation switches 62, 63 to obtain a smaller range of variation for the regulated output current. Switches 62, 63 may be operated to provide a slew current to the gate of pass FET 15 to achieve a slower turn on and turn off of pass FET 15. The slew current can help to slow the current draw on the backplane supply during an overload condition to avoid spikes or droops in voltage on the backplane.

Referring to FIG. 7, graphs 70, 72 illustrate operation of circuit 60 in the event of an overload condition. Graph 72 shows a dramatic increase in output current when the overload condition first occurs, causing a steep change in the voltage applied to the gate of pass FET 15, as illustrated in graph 70. During a fast regulation interval, graph 72 illustrates output current oscillating between a maximum threshold and a sensed current output threshold, during which switches 62 and 63 change state with each switching cycle. At the end of the fast regulation interval, during which the output current is significantly reduced or regulated, a fine regulation interval begins during which the output current is regulated within a much smaller range of values. The interval of fine regulation can continue for a relatively long period of time, during which the overload condition may be removed, so that normal operation may resume. If the overload condition persists, a timing control circuit in control block 65 can cause pass FET 15 to be shut down to ensure the load or pass FET 15 are not damaged.

Control block 65 in circuit 60 of FIG. 6 can include a number of timers that can be used to adjust the operation of circuit 60 in accordance with a given application. A timer may be used to determine a length of time during which an overload condition may be declared a transient. For example, a hundred microsecond timer may be started when an overload condition is sensed. If the timer times out without being reset, i.e., the overload condition does not persist, the overload condition is declared a transient and normal operation resumes. This type of timer can avoid nuisance transients that may occur during power up of devices in load 17, such as processors or capacitive loads.

Another timer that may be used in circuit 60 determines the length of time to apply fast regulation of output current through pass FET 15. For example, a 128 microsecond timer may be used to indicate the interval during which fast regulation is applied, after which fine regulation of output current may commence. Output current regulation during the fast regulation interval may involve relatively large currents, indicating that switch 64 may have a relatively high rating, for example, a 1 amp rated FET. The interval for fast regulation may be tailored to meet the current specifications of pass FET 15, such as peak current and sustained current parameters, for example.

Control block 65 may also include a timer for determining a length of time that current regulation may be applied while an overload fault exists prior to shutting off pass FET 15. For example, a 5 millisecond timer may be used to provide an interval for response to current overload, including output current regulation. At the end of the 5 millisecond time interval, if the overload fault continues to exist, pass FET 15 can be shut down to avoid damage to pass FET 15 or other components, including avoiding spikes or glitches on the backplane power supply. The overload fault time interval may include periods related to fast regulation and fine regulation of output current. For example, the fine regulation interval may commence and continue in the presence of an overload condition until the shutdown timer expires, at which point pass FET 15 is shut off.

One advantage in using smaller rated FETs 62, 63 to provide fine regulation of output current in the event of an overload condition, is to reduce EMI output and noise in the system by providing a smaller current variation during the fine regulation phase. Switching signal 67 supplied to the gates of switches 62, 63 may be provided based on a timing oscillator in control block 65 that can operate at a very high frequency, such as 1-2 MHz, for example. By providing a high frequency oscillator in control block 65, a rapid response to overcurrent conditions can be obtained. In addition, while switches 62, 63 are illustrated as CMOS switches tied together to a control signal 67, they may be operated independently. Switches 62, 63 may both be P-MOS, N-MOS or combinations of polarity types to meet the specifications of the application, which may depend on the type of power switch used to supply output current. Moreover, while switch 62 can be used to supply slew current for a normal turn on of pass FET 15, it is disconnected from the gate of pass FET 15 during normal operation to improve power performance, according to an exemplary embodiment. In such an embodiment, slew current is provided to the gate of pass FET 15 through another source. The ramped turn-on signal avoids high frequency transients in the backplane power supply that may be induced by rapid turn on of pass FET 15.

It should be apparent that the present invention described herein can be used with any type range of power supplies, including positive and negative power supplies and a wide range of output voltages and currents. The present invention provides an advantageously simple technique for regulating current with a class D topology that conserves power and provides a rapid response, while using a small amount of silicon area in a control 1C to achieve the regulation control.

Some types of applications where the present invention may be highly useful include hot pluggable or swappable devices, including USB ports, system backplanes including backplanes that meet the various PCI standards, as well as applications where it is highly desirable to maintain power to equipment while permitting the exchange of components or devices, such as is desirable in the power and telecommunications industry.

Although the present invention has been described in relation to particular embodiments thereof, other variations and modifications and other uses will become apparent to those skilled in the art from the description. It is intended therefore, that the present invention not be limited by the specific disclosure herein, but to be given the full scope indicated by the appended claims.

What is claimed is:

1. A system for responding to an overcurrent condition in a power switch having a gate, comprising:
    a main current source coupled to the gate for turning on the power switch and maintaining the power switch in an on state;
    an overcurrent sink and source coupled to the gate of the power switch in addition to the main current source and being switchable to sink or source current from or to the gate;
    an actuator circuit coupled to the overcurrent sink and source for switching the overcurrent sink or source;
    the actuator circuit having an input for receiving an indication of when the overcurrent condition occurs to permit the actuator circuit to switch the overcurrent sink or source to decrease or increase current supplied to the gate to respectively decrease or increase current supplied by the power switch in response to the indication.

2. The system according to claim 1 wherein the actuator circuit further comprises a comparator.

3. The system according to claim 1, wherein the overcurrent sink and source include switches arranged in a class D topology.

4. The system according to claim 3, wherein the switches are arranged in a CMOS configuration.

5. The system according to claim 1, wherein the power switch is part of a hot pluggable component.

6. The system according to claim 1, further comprising:
    a timer coupled to the actuator circuit and responsive to an output of the actuator circuit to initiate timing of a predetermined time interval, the timer being reset in response to the output of the actuator circuit indicating that an overcurrent condition exists; and
    an output of the timer being operable to reset the system for response to an overcurrent condition when the overcurrent condition occurs for an interval of time smaller than the predetermined time interval.

7. The system according to claim 1, further comprising a control coupled to the actuator circuit and the overcurrent sink and source and operable to switch the overcurrent sink and source according to a predetermined control scheme.

8. The system according to claim 7, wherein the control scheme further comprises alternately switching the overcurrent sink and source to obtain a fast response to the overcurrent condition to maintain output current below a given threshold.

9. The system according to claim 7, wherein the control scheme further comprises alternately switching the overcurrent sink and source for regulation of output current within a relatively narrow range.

10. The system according to claim 7, wherein the control scheme further comprises switching the overcurrent sink and source to shut down the power switch.

11. The system according to claim 1, wherein at least one of the overcurrent sink and source further comprises an additional corresponding overcurrent sink or source having a faster response than the overcurrent sink or source, whereby switching the additional overcurrent sink or source contributes to reducing power switch output current relatively quickly upon detection of the overcurrent condition.

12. A method for responding to an overload condition for a power switch having a gate, the method comprising:
    supplying a main current to the gate of the power switch to switch and maintain the power switch in a conducting state;
    providing a signal indicative of an overcurrent in the power switch;
    switching a control current sink or source to the gate of the power switch in addition to the main current in response to the signal to decrease or increase current applied to the gate of the switch to respectively decrease or increase current supplied by the power switch.

13. The method according to claim 12, wherein switching the control current sink or source further comprises switching switches in a class D topology coupled to the gate of the power switch.

14. The method according to claim 12, wherein switching the control current sink or source further comprises switching a secondary switch to sink or source additional control current on the gate, the secondary switch having a faster response than the control current sink or source to reduce power switch output current relatively quickly upon detection of an overload condition.

15. The method according to claim 14, wherein switching the control current sink or source further comprises ceasing switching of the secondary switch and regulating current supplied by the power switch within a range more narrow than that available by switching the secondary switch by continuing switching of the control current sink or source during an overload condition.

16. The method according to claim 12, further comprising:
    starting a timer to time the application of the switching of the control current sink or source to the gate of the power switch; and
    switching a different control current sink or source to the gate of the power switch at the end of a time interval determined by the timer.

17. The method according to claim 12, further comprising:
    starting a timer to time the application of the switching of the control current sink or source to the gate of the power switch; and
    shutting off the power switch at the end of a time interval determined by the timer.

18. A circuit coupled to a power switch having a gate and an output, and being responsive to an overload condition, the circuit comprising:
    a main current source coupled to the gate for turning on the power switch and maintaining the power switch in an on state;
    a plurality of switches arranged in a class D topology with a common switch node coupled to the gate of the power switch in addition to the main current source and being switchable to sink or source current from or to the gate;
    a control circuit coupled to the plurality of switches for switching the switches on and off to control current applied to the gate of the power switch;

an input to the control circuit coupled to the output of the power switch and configured to receive an indication of power switch output current; and the control circuit being operable to switch the switches to sink current from the gate to decrease power switch output current in response to the overload condition based on the indication and to source current to the gate to increase power switch output current when the power switch output current decreases to cross a predetermined threshold in response to the overload condition based on the indication.

19. The circuit according to claim 18, further comprising a comparator in the control circuit for determining when the indication indicates that power switch output current is greater than or less than the predetermined threshold.

20. The circuit according to claim 18, further comprising one or more timers in the control circuit for switching the switches to regulate power switch output current during an interval defined by the one or more timers.

* * * * *